INVENTORS:
Harold B. Rose
David B. Nielsen
By Jessup and Beecher
Warren T. Jessup
ATTORNEYS INVENTORS:
Harold B. Rose
David B. Nielsen
Jessup and Beecher
By Warren T. Jessup
ATTORNEYS INVENTORS:
Harold B. Rose
David B. Nielsen
By Kemp and Beasley
Warren T. Jessup
ATTORNEYS

United States Patent Office 3,514,717

Patented May 26, 1970

3,514,717

WIEN BRIDGE OSCILLATOR WITH LOW TRANSIENT FREQUENCY SWITCHING CIRCUIT

Harold B. Rose, Monterey Park, and David B. Nielsen, Pasadena, Calif., assignors to Behlman-Invar Electronics Corp., Santa Monica, Calif., a corporation of Delaware Filed Aug. 14, 1968, Ser. No. 752,691

Int. Cl. H03b 5/26; H03j 5/24

U.S. Cl. 331—141 9 Claims

ABSTRACT OF THE DISCLOSURE

A Wien bridge oscillator which may be switched rapidly, from one frequency to another for frequency multiplexing, or other purposes, and which exhibits negligible switching transients. The switching cycles are controlled by logic circuitry so that switching from one frequency to another occurs, for example, at the low energy levels of the individual signal frequencies.

BACKGROUND OF THE INVENTION

The circuit and system of the present invention provides a discretely identifiable time reference point at which switching from one frequency ($f_1$) to another frequency ($f_2$) occurs in the aforesaid signal generator. The time reference point is chosen to be such that transient perturbations in the signal generator output amplitude are minimized, as well as frequency transients and instability, as the generator is switched from the frequency ($f_1$) to the frequency ($f_2$), and vice versa.

When the signals generated by the generator of the invention are of a sinusoidal waveform, for example, a discretely identifiable point on the waveform, which can be established with precision, is the time at which the wave passes through zero amplitude, either in the negative-going direction or in the positive-going direction. Minimum transient perturbations may be expected if the switching from the frequency ($f_1$) to the frequency ($f_2$), for example, occurs at the zero crossing points. This is because of the low residual energy levels in the signal at these points, as mentioned above.

In the embodiment of the invention to be described, the aforesaid criterion is achieved by modifying a conventional Wien bridge oscillator. This modification is achieved by switching different resistance values in and out of the frequency-determining circuit of the oscillator so as to achieve predetermined frequency shifts from one frequency to another, and also by providing logic control circuitry which causes the frequency shifting to occur only at the zero crossing points of the individual signals.

When a two-stage amplifier and a bridge circuit is incorporated in the conventional Wien bridge oscillator, the output signal is in phase with the input signal at the balance frequency ($f_0$) of the bridge circuit. Hence, the bridge circuit may be used as the feedback network for the oscillator, provided that the phase shift through the amplifier is zero. This condition is met by the provision of the two-stage amplifier. The frequency of the oscillator is precisely the null frequency of the balanced bridge, namely:

$$f_0 = 1/2\pi RC$$

As is well known, in order for the conventional Wien bridge oscillator to sustain oscillations, the Barkhausen criterion must be met. That is, $\beta A$ must be equal or greater than 1; where A is the gain of the amplifier and $\beta$ is the feedback factor.

However, when the bridge circuit in the Wien bridge oscillator is balanced, the product $\beta A$ equals zero. Therefore, to sustain oscillation, the bridge must be unbalanced, and yet the phase shift must remain zero. This is achieved by selecting an appropriate ratio for the resistors which make up the bridge circuit, as is known to the art.

In the practice of the present invention, the low distortion, high frequency and amplitude stability, and wide frequency range characteristics of the Wien bridge oscillator are utilized in a switchable, multiple frequency, low transient distortion signal generator. The resulting signal generator may be used, for example, to evaluate and calibrate the time response of frequency sensitive electrical devices to a step change in frequency. Moreover, the signal generator may be used as the signal source for a multiplex signaling system, and it has a variety of other uses.

DETAILED DESCRIPTION OF THE ILLUSTRATED EMBODIMENT

Figure 1:
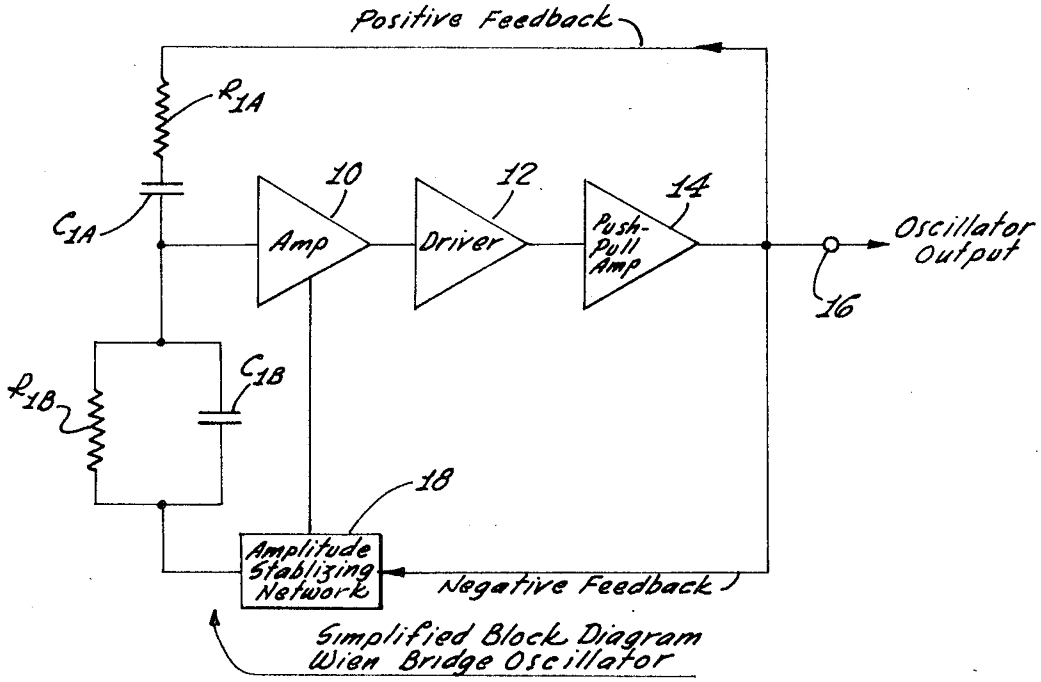
Fig. 1 (Prior Art)
FIG. 1 is a simplified block diagram of a conventional Wien bridge oscillator.

The basic Wien bridge oscillator as represented by the diagram of FIG. 1 includes, for example, an amplifier 10. The output from the amplifier 10 passes through a driver stage 12 to a push-pull amplifier 14. The resultant translation of signals through the stages 10, 12 and 14 results in an output having the same phase as the input. The resulting output appears, for example, at an output terminal 16.

A positive feedback path is established through a resistor $R_{1A}$ and through a series connected capacitor $C_{1A}$ to the input of the amplifier 10. A negative feedback path is established through a typical amplitude stabilizing network 18, and through a parallel connected resistor $R_{1B}$ and $C_{1B}$.

The basic oscillator illustrated in FIG. 1 comprises, therefore, the amplifier 10, the driver 12 and the push-pull output amplifier 14. The positive feedback, which sustains oscillation, is from the output, through the series resistance/capacitance network $R_{1A}$ and $C_{1A}$ to the input of the amplifier 10. The negative feedback path which controls the output signal amplitude, is established from the output of the amplitude stabilizing network 18, through the parallel connected resistor $R_{1B}$ and capacitor $C_{1B}$, to the input of the amplifier 10.

Figure 2:
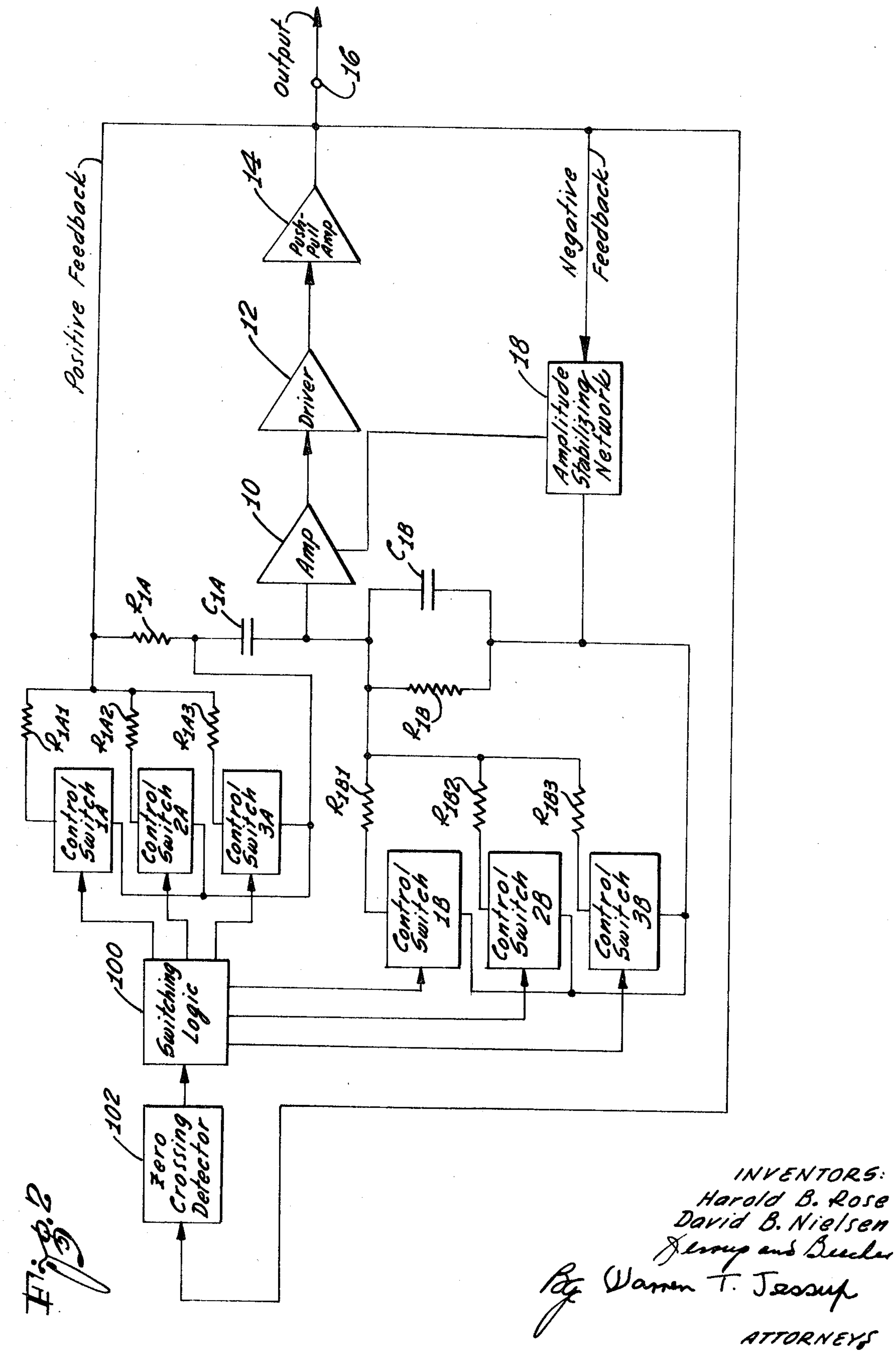
FIG. 2 is a block diagram of the Wien bridge oscillator modified in accordance with the concepts of the present invention.

As is known, variations in the capacitors $C_{1A}$ and $C_{1B}$ may be used to produce a continuous variation in the output frequency of the oscillator. Moreover, stepped variations of the resistors $R_{1A}$ and $R_{1B}$ may be effectuated to provide different frequency ranges for the oscillator by stepped frequency shifts thereof. In adapting the oscillator to FIG. 1 to the concepts of the present invention, and as shown in FIG. 2, different frequencies are achieved by selectively switching resistors $R_{1A1}$, $R_{1A2}$ and $R_{1A3}$ in shunt with the resistor $R_{1A}$, so as to vary different resistance values in conjunction with the capacitor $C_{1A}$; and simultaneously switching identical corresponding resistance values, as designated $R_{1B1}$, $R_{1B2}$ and $R_{1B3}$ in shunt with the resistor $R_{1B}$, so as to provide corresponding resistance changes in shunt with the capacitor $C_{1B}$.

The switching of the various resistors $R_{1A1}$, $R_{1A2}$, $R_{1A3}$ and $R_{1B1}$, $R_{1B2}$, $R_{1B3}$, as described above, is controlled by control switches designated 1A, 2A, 3A and 1B, 2B and 3B. For example, when the control switches 1A and 1B are actuated, a simultaneous resistance change is effectuated in circuit with the capacitors $C_{1A}$ and $C_{1B}$ respectively, so as to change the oscillator frequency from one predetermined value to another. Likewise, a second predetermined frequency change is effectuated when the control switches 2A and 2B are actuated, and a third predetermined frequency change is effectuated when the control switches 3A and 3B are actuated. It will be appreciated that the number of pairs of control switches included in the circuit is dictated by the number of frequency shifts desired.

The control of the aforesaid control switches is achieved by means of a switching logic circuit 100 in conjunction with the output from a zero crossing detector 102, as will be described in conjunction with FIG. 4. The control is such that, as expressed above, the switching from one frequency to another occurs when the particular signal being swtiched is passing through the zero reference, so that the switching may be achieved with a minimum of transient disturbances.

Figure 3:
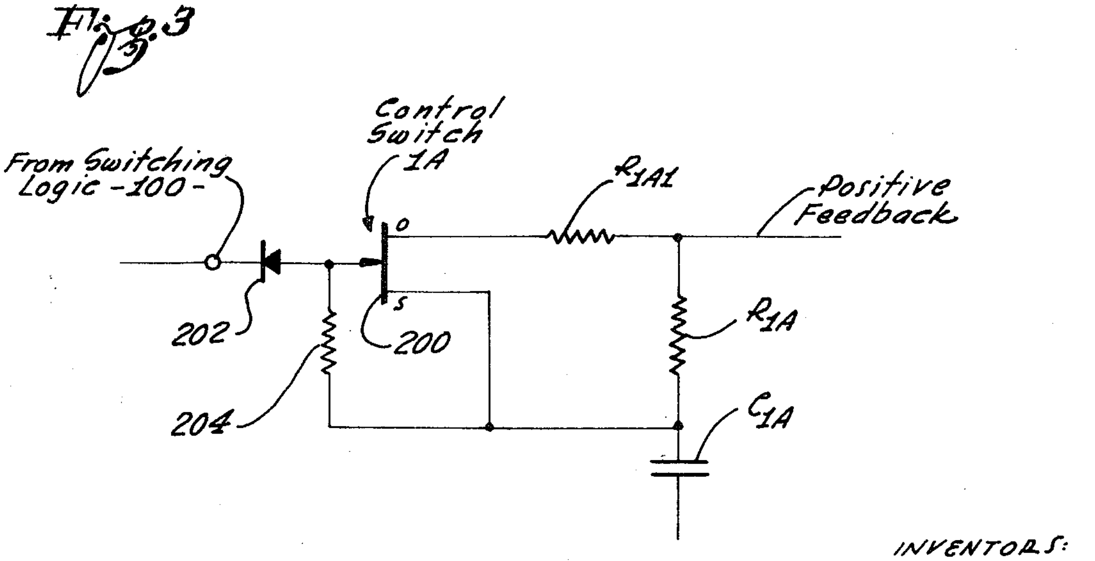
FIG. 3 is a detail of a control switch circuit which may be used in each of the various control switches used in the circuit of FIG. 2.

The individual control switches referred to above may have the circuitry which is shown in FIG. 3 as appropriate for the control switch 1A. The circuitry of FIG. 3 includes a field effect transistor 200. The signal from the switching logic 100 is passed through a diode 202 to the gate electrode of the field effect transistor. The gate electrode is connected through a resistor 204 to the source electrode, and also to the junction of the aforesaid resistor $R_{1A}$ and capacitor $C_{1A}$. The resistor $R_{1A1}$ is connected to the resistor $R_{1A}$ and to the drain electrode of the field effect transistor.

As shown in FIG. 3, the field effect transistor 200 is used as a control switch to connect the resistor $R_{1A1}$ in parallel with the resistor $R_{1A}$, upon the introduction of the corresponding logic control signal from the switching logic circuit 100. The field effect transistor switches of FIG. 2 select the desired combination of resistors and capacitors in both the series and parallel legs of the Wien bridge oscillator to provide, for example, three distinct frequencies, as selected by the frequency selection circuits.

Figure 4:
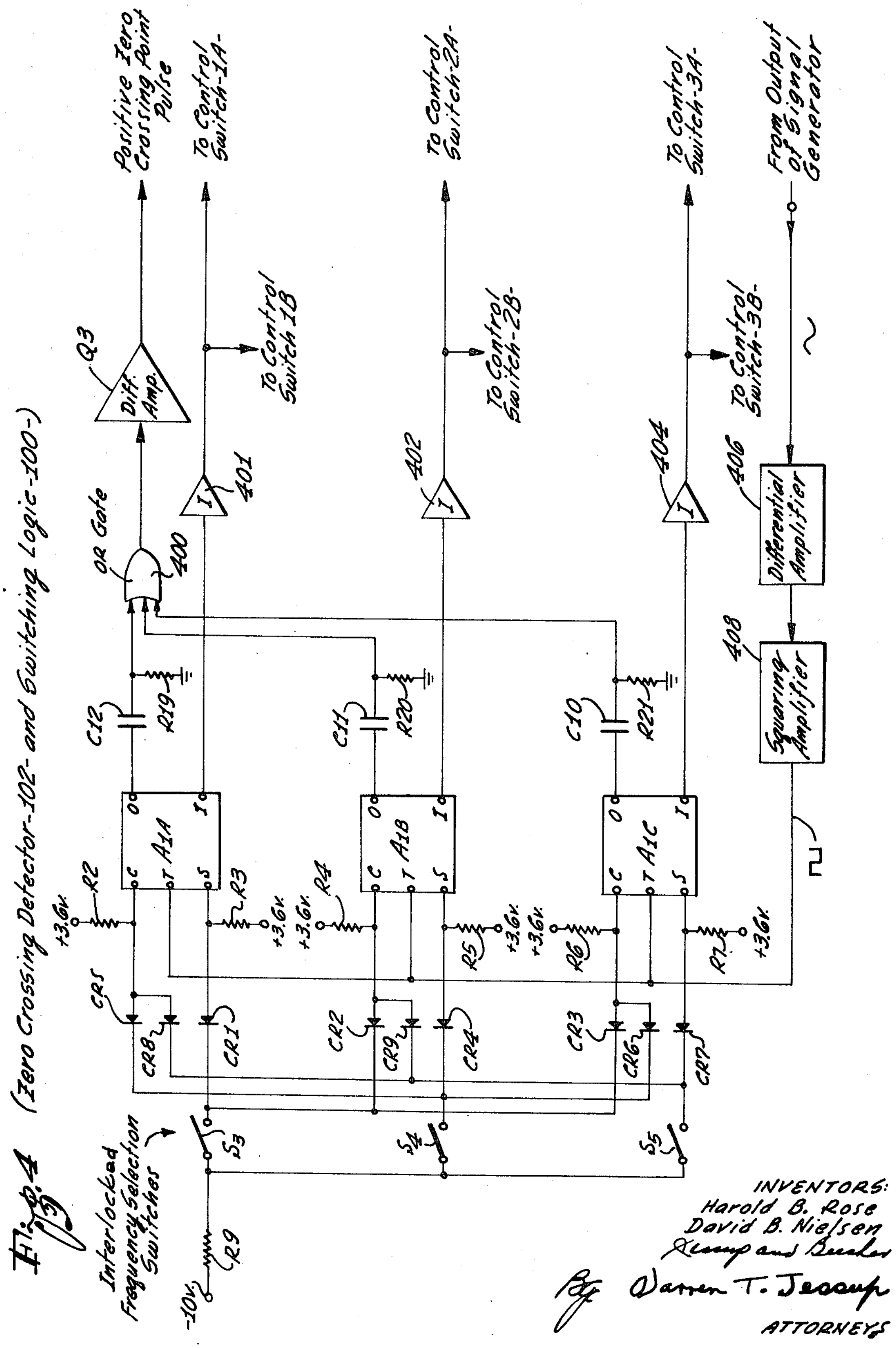
FIG. 4 is a more detailed diagram of certain components of the circuit of FIG. 2.

The frequency selection circiuts themselves, as well as the zero crossing detector 102 and switching logic 100 are shown in more detail in FIG. 4. For example, three switches S3, S4 and S5 may be provided, the switches being connected through a resistor $R_9$ to the negative terminal of a 10-volt unidirectional voltage source. The switches S3, S4 and S5 may be interlocked, so that when any particular switch is closed to establish a predetermined frequency in the oscillator, the other two switches are opened.

The switches S3, S4 and S5 are connected through a diode CR1 to the set input terminal of a flip-flop A1A, and through diodes CR2 and CR3 to the clear input terminals of respestive flip-flops A1B and A1C. The switches are also connected through a diode CR4 to the set input terminal of the flip-flop A1B, and through diodes CR5 and CR6 to the clear input terminals of the flip-flops A1A and A1C. Finally, the switches are connected through a diode CR7 to the set input terminal of the flip-flop A1C, and through diodes CR8 and CR9 to the clear input terminals of the flip-flops A1A and A1B respectively.

The zero output terminals of the three flip-flops A1A, A1B and A1C are connected through respective differentiating networks C12R19, C11R20, and C10R21, to an "or" gate 400, the output of which is introduced to a differential amplifier Q3 which produces a positive zero crossing point pulse.

The "1" output terminals of the flip-flops A1A, A1B, A1C, on the other hand, are connected through respective inverters 401, 402 and 404 to the control switches 1A, 1B; 2A, 2B; and 3A, 3B, respectively. The output from the signal generator (which is assumed to be a sine wave) is introduced to a differential amplifier 406, the output of which is passed through a squaring amplifier 408 to the toggle terminals of the flip-flops A1A, A1B and A1C. The differential amplifier 406 and squaring amplifier 408 make up the zero crossing detector represented by the block 102 in FIG. 2.

As explained above, the system is constructed logically to transfer from one frequency to another at the point of time when the particular output sine wave is passing through a zero amplitude condition in, for example, the negative direction. Switching from one frequency to another at this point takes place in a few microseconds. During this time, a minimum of stored energy is present in the oscillator frequency-determining components, and an essentially energy-less frequency transfer occurs. Since this is the case, a minimum of transient perturbation is experienced in the output due to the shift in the bridge and oscillator generating frequency.

As mentioned above, a frequency selection is accomplished by actuating any one of the interlocked switches S3, S4 or S5. When the switch S3 is closed, for example, the diodes CR1, CR2 and CR3 become forward biased, and the set side of the flip-flop A1A is pulled towards ground, whereas the clear sides of the flip-flops AlB and A1C are pulled towards ground. When the square wave output from the squaring amplifier 408 is applied to the toggle or trigger input of all three inputs, the flip-flop A1A becomes cleared and its zero output goes high, whereas the two remaining flip-flops are set and their zero outputs go low.

The resulting positive-going signal from the zero output of the flip-flop A1A is differentiated by the network C12 and R19, and the resulting positive-going pulse is applied to the "or" gate 400. The "or" gate output is then taken through the differential amplifier Q3, and it becomes the start-initiate pulse output from the circuit. Simultaneously, the negative-going signal from the 1 output of the flip-flop A1A is inverted by the inverter 401 and is used to actuate the field effect transistor switches 1A and 1B. The result is the insertion of the resistors $R_{1A1}$ and $R_{1B1}$ into the circuit of the Wien bridge oscillator to produce a corresponding change in frequency output. A similar result occurs when either the switch S4 or the switch S5 is closed. It should be noted that mechanical relays or other switches may be used in place of the field effect transistors.

From the foregoing circuit analysis, it can be seen that the start output pulse occurs at zero cross-over of the squared Wien bridge oscillator sine wave, as derived from the squaring amplifier 408, at which instant, one of the three selection flip-flops. A1A, A1B and A1C causes the oscillator to change frequency through the gating of the corresponding pair of field effect transistor switches.

The invention provides, therefore, an improved oscillator circuit which is constructed to be switched from one frequency to another with a minimum of transient perturbations. It will also be appreciated that while a particular embodiment of the invention has been described, modifications may be made.

What is claimed is:

1. An oscillator circuit for generating an output signal including frequency-determining circuit means, and switching circuit means coupled thereto for selectively changing from a first predetermined value to a second predetermined value the parameters of said frequency-determining circuit means and the resulting frequency of said output signal, and control circuit means coupled to said switching circuit means for causing said switching circuit means to be actuated when the output signal is passing through a predetermined reference value.

2. The oscillator circuit defined in claim 1, in which said control circuit means is coupled to the output of said oscillator and is responsive to said output signal.

3. The oscillator circuit defined in claim 1, in which said predetermined reference value of said output signal corresponds to a minimum energy level therein.

4. The oscillator circuit defined in claim 1, in which said frequency-determining circuit means includes resistance means and capacitance means.

5. The oscillator circuit defined in claim 4, in which said switching circuit means selectively switches additional resistance means in circuit with the aforesaid resistance means.

6. The oscillator circuit defined in claim 1, in which said frequency determining circuit means constitutes a Wien oscillator bridge network.

7. The oscillator circuit defined in claim 1, in which said switching circuit means includes field effect transistors.

8. The oscillator circuit defined in claim 1, in which said control circuit means includes frequency selection switches for establishing a selected frequency for the oscillator circuit, flip-flop circuits respectively connected to said frequency selection switches, and conditioned thereby to establish a selected frequency for the oscillator circuit, and in which said control circuit means is coupled to said flip-flops to actuate the flip-flops at the precise moment the output signal from the oscillator is passing through a predetermined reference value.

9. The oscillator circuit defined in claim 2, in which said control circuit means includes a differential amplifier for differentiating the output of the oscillator, and a squaring amplifier for squaring the output of said differential amplifier, the squaring amplifier producing a square wave signal having cycles passing through the aforesaid reference value in time coincidence with said output signal.

References Cited

UNITED STATES PATENTS

| | | | |
|---|---|---|---|
| 2,444,084 | 6/1948 | Artzt | 331—141 X |
| 2,789,216 | 4/1957 | Uthene | 328—271 |
| 3,417,349 | 12/1968 | Schneider | 331—177 X |

ROY LAKE, Primary Examiner

S. H. GRIMM, Assistant Examiner

U.S. Cl. X.R.

307—242, 244; 331—179